(12) United States Patent
Sunairi

(10) Patent No.: US 7,449,940 B2
(45) Date of Patent: Nov. 11, 2008

(54) BUFFER CIRCUIT

(75) Inventor: Souji Sunairi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 47 days.

(21) Appl. No.: 11/390,137

(22) Filed: Mar. 28, 2006

(65) Prior Publication Data

US 2006/0244489 A1 Nov. 2, 2006

(30) Foreign Application Priority Data

Apr. 28, 2005 (JP) ............................. 2005-131211

(51) Int. Cl.
*G05F 1/10* (2006.01)
*G05F 3/02* (2006.01)

(52) U.S. Cl. ......................... 327/541; 326/33; 326/34; 326/86

(58) Field of Classification Search ............. 326/31–34, 326/82–83, 86–87; 327/108–109, 538–550
See application file for complete search history.

(56) References Cited

U.S. PATENT DOCUMENTS

| 5,748,011 A | 5/1998 | Takahashi et al. | |
| 5,933,025 A | 8/1999 | Nance et al. | |
| 6,847,248 B2 * | 1/2005 | Ajit | 327/313 |
| 7,049,847 B2 * | 5/2006 | Kitazawa et al. | 326/56 |
| 2003/0122606 A1 * | 7/2003 | Ajit et al. | 327/309 |
| 2004/0212398 A1 | 10/2004 | Kitazawa et al. | |

FOREIGN PATENT DOCUMENTS

JP 2004-328443 11/2004

OTHER PUBLICATIONS

European Search Report dated Jul. 17, 2006.

* cited by examiner

*Primary Examiner*—James H. Cho
*Assistant Examiner*—Jason Crawford
(74) *Attorney, Agent, or Firm*—McGinn IP Law Group, PLLC

(57) ABSTRACT

A buffer circuit capable of switching between input mode and output mode includes a first transistor for outputting a prescribed voltage to an input/output terminal depending on a conductive state during the output mode of the buffer circuit, a pre-driver for controlling the conductive state of the first transistor during the output mode of the buffer circuit, and a power supply circuit for providing a first power supply to the pre-driver during the output mode of the buffer circuit and providing or blocking the first power supply to the pre-driver in accordance with an input voltage to the input/output terminal during the input mode of the buffer circuit.

20 Claims, 12 Drawing Sheets

Fig. 2

BUFFER CIRCUIT

BACKGROUND OF THE INVENTION

1. Field of the Invention

The present invention relates to buffer circuits and, particularly, to a buffer circuit which does not allow a current to flow inside a terminal even when a voltage higher than a power supply voltage is input from outside of the terminal.

2. Description of Related Art

Recent semiconductor apparatus have multiple functions, and enormous variety of input/output signals are used. At the same time, the semiconductor apparatus are required to have as small number of terminals as possible. A recently adopted approach to meet this requirement is to use one terminal in both input mode and output mode. Meanwhile, in order to reduce power consumption, a recent technique operates a semiconductor apparatus and the semiconductor apparatus mounted in electronic equipment by using a plurality of power systems corresponding to their functions, e.g. 3.3V power system and 5.0V power system, thereby operating one electronic equipment. In such electronic equipment, when a signal is input from the 5.0V power system to the semiconductor apparatus of 3.3V power system, a current flows undesirably inside the semiconductor apparatus of 3.3V power system. In order to overcome this drawback, a buffer circuit (tolerant buffer circuit) which prevents a current from flowing inside a terminal upon input of a voltage higher than a power supply voltage may be used. For example, the buffer circuit which operates with the 3.3V power system outputs a signal with an amplitude ranging from the ground to 3.3V in the output mode. In the input mode, on the other hand, the buffer circuit receives a signal, setting its terminal at a high impedance state. Further, when the 3.3V system buffer circuit receives an input from the semiconductor apparatus of 5.0V power system, it can receive a signal with an amplitude ranging from the ground to 5.0V while preventing a current from flowing inside a terminal. An example of such a buffer circuit is disclosed in Japanese Unexamined Patent Application Publication No. 2004-328443.

FIG. 12 shows a typical buffer circuit 1200 in a related art. A typical buffer circuit 1200 of a related art is described herein with reference to FIG. 12. The buffer circuit 1200 is in the output mode when an OEB signal is at Low level (e.g. ground voltage) and in the input mode when it is at High level (e.g. power supply voltage).

The operation of the buffer circuit 1200 in the output mode is as follows. When the OEB signal is at Low level, the buffer circuit 1200 outputs a signal of the same logic as an input DATA signal from an output stage 1201.

The operation of the buffer circuit 1200 in the input mode is as follows. When the OEB signal is at High level, the buffer circuit 1200 sets an OUTP signal at Low level and OUTN signal at High level regardless of the state of the DATA signal. A PMOS transistor P1 and an NMOS transistor N1 in the output stage 1201 thereby become nonconductive. The node 1 of the output stage 1201 thus enters a high impedance state, so that an input buffer 1208 receives the signal.

In some cases, a signal having an amplitude of an external power supply voltage which is higher than a power supply voltage VDD is input as an input voltage. In order to prevent a current from flowing inside in this case, the buffer circuit 1200 has a gate controller 1206 and a transfer gate 1204.

The gate controller 1206 sets the gate voltage of the PMOS transistor P1 at an external power supply voltage upon input of the external power supply voltage, thereby preventing the PMOS transistor P1 from becoming conductive.

The transfer gate 1204 avoids that an external power supply voltage is applied to a pre-driver 1202 upon input of the external power supply voltage. This prevents backflow current to the power supply voltage VDD which is connected to the pre-driver 1202.

The buffer circuit 1200, however, needs to delay the timing for switching the transfer gate 1204 into the nonconductive state by using a delay circuit when switching between the input and output modes in order to set the PMOS transistor P1 absolutely nonconductive. It is thus required to design a delay circuit for making a delay time and adjust the timing.

In addition, it is necessary in the transfer gate 1204 to have a large transistor size in order to reduce a parasitic resistance of the transistor, which causes an increase in the size of a semiconductor apparatus. Further, the rise of the signal at the PMOS transistor P1 is slow due to the parasitic resistance of the transistor of the transfer gate 1204, which causes a limitation in operation speed.

SUMMARY OF THE INVENTION

According to an aspect of the present invention, there is provided a buffer circuit capable of switching between input mode and output mode, which includes a first transistor for outputting a prescribed voltage to an input/output terminal depending on a conductive state during the output mode of the buffer circuit, a pre-driver for controlling the conductive state of the first transistor during the output mode of the buffer circuit, and a power supply circuit for providing a first power supply to the pre-driver during the output mode of the buffer circuit and providing or blocking the first power supply to the pre-driver in accordance with an input voltage to the input/output terminal during the input mode of the buffer circuit.

In the buffer circuit of the present invention, when the buffer circuit is in the input mode, the power supply circuit supplies or blocks a power supply voltage to the pre-driver in accordance with the voltage input to the input/output terminal, thereby preventing a current from flowing back from the input/output terminal to the power supply voltage. The pre-driver can therefore directly drives the first transistor, thus enabling to switch between input and output modes without delay. Further, the present invention eliminates the need for a transfer gate for preventing a backflow current and a delay circuit for delaying the switching operation of the transfer gate, thus enabling to reduce the number of devices and downsize a semiconductor apparatus.

BRIEF DESCRIPTION OF THE DRAWINGS

The above and other objects, advantages and features of the present invention will be more apparent from the following description taken in conjunction with the accompanying drawings, in which:

FIG. 2 is a circuit diagram altered from the buffer circuit shown in FIG. 1;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
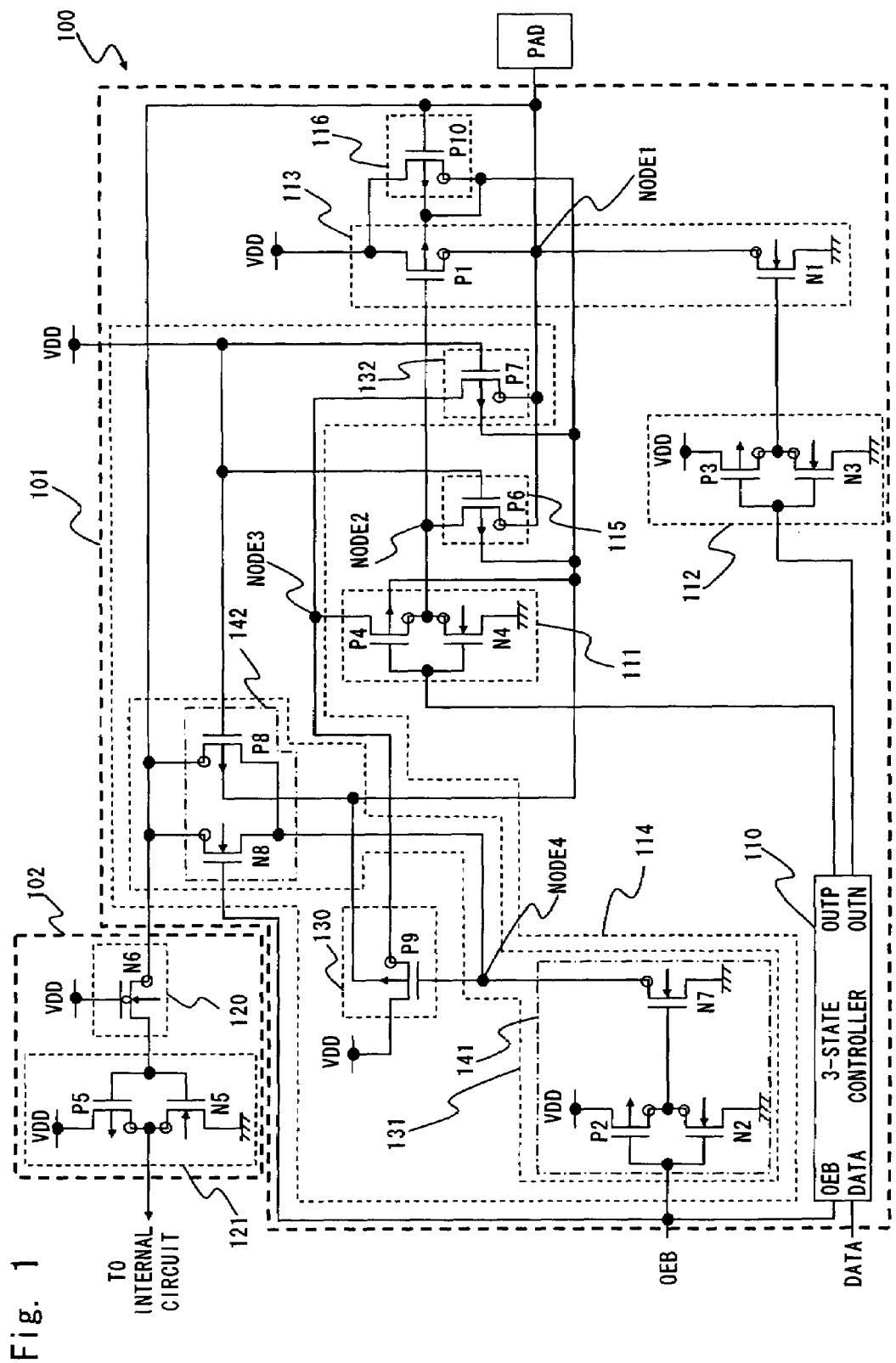
FIG. 1 is a circuit diagram of a buffer circuit according to a first embodiment of the present invention.

FIG. 1 shows the buffer circuit 100 according to a first embodiment of the present invention. The buffer circuit 100 is described hereinafter in detail with respect to FIG. 1. The buffer circuit 100 uses a single input/output (I/O) terminal in both input mode and output mode. The I/O terminal of the buffer circuit is connected, for example, to an I/O terminal of a semiconductor apparatus. The buffer circuit includes an output buffer 101 for use in the output mode and an input buffer 102 for use in the input mode. The output buffer 101 outputs a signal DATA which is supplied from an internal circuit to the I/O terminal during the output mode. The input buffer 102 outputs the signal input to the input/output circuit into the internal circuit. The output mode and the input mode are switched by an OEB signal which is input to the buffer circuit 100 from the internal circuit. If the OEB signal is at Low level (e.g. ground voltage GND), the buffer circuit 100 enters the output mode; if the OEB signal is at High level (e.g. power supply voltage VDD), the buffer circuit 100 enters the input mode.

The output buffer 101 and the input buffer 102 are described in detail below. In the following description, MOS transistors except for a depression-type MOS transistor, which is described later, are basically enhancement-type MOS transistors having a threshold voltage of Vt.

The output buffer 101 includes a 3-state controller 110, pre-drivers 111 and 112, an output stage 113, a power supply circuit 114, a gate controller 115, and an N-well controller 116.

The 3-state controller 110 outputs the DATA signal or a predetermined signal according to the OEB signal. In the output mode, the 3-state controller 110 outputs the same signal as the DATA signal supplied from the internal circuit through both the OUTP terminal and the OUTN terminal as an OUTP signal and an OUTN signal, respectively. In the input mode, the 3-state controller 110 outputs the OUTP signal and OUTN signal which are predetermined to set the I/O terminal at the high impedance state.

The pre-drivers 111 and 112 respectively drive the PMOS transistor P1 and the NMOS transistor N1 of the output stage 113. The pre-drivers 111 and 112 respectively output inverted signals of the OUTP signal and the OUTN signal from the 3-state controller 110. The pre-drivers 111 and 112 are inverters each including a PMOS transistor and a NMOS transistor.

Since the pre-drivers 111 and 112 are inverters, the gates of the PMOS transistor P4 and the NMOS transistor N4 are supplied with the OUTP signal. The gates of the PMOS transistor P3 and the NMOS transistor N3 are supplied with the OUTN signal.

From the node between the PMOS transistor P4 and the NMOS transistor N4, a signal for driving the PMOS transistor P1 is output. From the node between the PMOS transistor P3 and the NMOS transistor N3, a signal for driving the NMOS transistor N1 is output.

The source of the NMOS transistor N4 of the pre-driver 111 is grounded and the source of the PMOS transistor P4 is connected to the node 3. Through the node 3, a voltage from the power supply circuit 114 is supplied to the pre-driver 111. The voltage applied to the node 3 and the power supply circuit 114 are detailed later.

The source of the NMOS transistor N3 of the pre-driver 112 is grounded and the source of the PMOS transistor P3 is connected to the power supply voltage VDD.

The output stage 113 is a circuit which outputs a signal corresponding to the DATA signal in the output mode and sets the I/O terminal (node 1) to the high impedance state in the input mode. The output stage 113 includes the PMOS transistor P1 and the NMOS transistor N1 connected in series between the power supply voltage VDD and the ground voltage GND.

The source of the PMOS transistor P1 is connected to a first voltage (e.g. power supply voltage VDD) and the source of the NMOS transistor N1 is grounded. The drain of the PMOS transistor P1 serves as the I/O terminal (node 1) of the buffer circuit 100.

The output stage 113 operates as an inverter in the output mode since the gate of the PMOS transistor P1 and the gate of the NMOS transistor N1 are supplied with the signals of the same logic. Thus, in the output mode, the output stage 113 outputs an inverted signal of the DATA signal which has been inverted in the pre-drivers 111 and 112.

In the input mode, on the other hand, both of the PMOS transistor P1 and the NMOS transistor N1 become nonconductive according to a predetermined signal output from the 3-state controller 110. This sets the I/O terminal (node 1) at the high impedance state.

The power supply circuit 114 supplies a voltage to the pre-driver 111. The voltage from the power supply circuit 114 is applied to the node 3 (the source of the PMOS transistor P4 of the pre-driver 111) described above. In the output mode, the power supply circuit 114 supplies the first voltage (e.g. power supply voltage VDD) to the pre-driver 111. In the input mode, the power supply circuit 114 selects either one of the power supply voltage VDD or the voltage input to the I/O terminal according to the voltage input to the I/O terminal and supplies the selected voltage to the pre-driver 111. The detailed configuration of the power supply circuit 114 is described later.

The gate controller 115 controls the gate voltage of the PMOS transistor P1 of the output stage 113. If a voltage higher than the power supply voltage VDD is input to the I/O terminal in the input mode, the gate controller 115 supplies the input voltage to the gate of the PMOS transistor P1.

One terminal of the gate controller 115 is connected to the line which connects the pre-driver 111 and the gate terminal of the PMOS transistor P1 of the output stage 113, and the other terminal of the gate controller 115 is connected to the I/O terminal. In the output mode, the gate controller 115 becomes nonconductive. In the input mode and when a voltage higher than the power supply voltage VDD is input to the I/O terminal (node 1), the gate controller 115 becomes conductive.

The N-well controller 116 controls the voltage of the N-well where the PMOS transistors P1, P4 and P6 to P10 are formed. In the first embodiment, the N-well controller 116 is composed of a PMOS transistor P10. The gate of the PMOS transistor P10 is connected to the I/O terminal and the source is connected to the power supply voltage VDD. The drain of the PMOS transistor P10 is connected to the N-well where the PMOS transistors P1, P4 and P6 to P10 are formed.

The N-well controller 116 sets the voltage of the N-well of the PMOS transistors P1, P4 and P6 to P10 at the power supply voltage VDD when the voltage of the I/O terminal is lower than VDD−|Vt|. If, on the other hand, the voltage of the I/O terminal is higher than VDD−|Vt|, the N-well controller 116 blocks the connection between the N-well of the PMOS transistors P1, P4 and P6 to P10 and the power supply voltage VDD. Therefore, even when the voltage of the I/O terminal is higher than the power supply voltage VDD, it is possible to operate the PMOS transistors normally by preventing a current from flowing into the power supply voltage VDD through the N-well.

The input buffer circuit 102 includes a level shifter 120 and an inverter 121. The level shifter 120 is connected between the I/O terminal and the inverter 121. The level shifter 120 is a depression-type MOS transistor with a low threshold voltage Vth (e.g.−0.2V). The gate of the level shifter 120 is connected to the power supply voltage VDD, the drain is connected to the I/O terminal, and the source is connected to the inverter 121. If the threshold voltage is Vth, when a voltage lower than (VDD+|Vth|) is input to the I/O terminal, the level shifter 120 transmits the input voltage as it is to the inverter 121. On the other hand, when a voltage higher than (VDD+|Vth|) is input to the I/O terminal, the level shifter 120 transmits the voltage of (VDD+|Vth|) to the inverter. The inverter 121 transmits an inverted voltage of the input signal to the internal circuit.

The configuration of the power supply circuit 114 is described in further detail herein. The power supply circuit 114 includes a power supply voltage switch 130, a power supply voltage switch controller 131 and an I/O terminal voltage transfer 132.

The power supply voltage switch 130 supplies or blocks the power supply voltage VDD to the pre-driver 111. In this embodiment, the power supply voltage switch 130 is composed of a PMOS transistor P9. The source of the PMOS transistor P9 is connected to the power supply voltage VDD and the drain is connected to the node 3. The voltage is supplied to the pre-driver 111 through the node 3. The gate voltage of the PMOS transistor P9 is controlled by the power supply voltage switch controller 131. If the connection between the gate of the power supply voltage switch 130 and the power supply voltage switch controller 131 is referred to as a node 4, the node 4 serves as the output of the power supply voltage switch controller 131. The power supply voltage switch 130 is conductive when the output of the power supply voltage switch controller 131 is Low level, while it is nonconductive when the output of the power supply voltage switch controller 131 is a voltage of (VDD−|Vt|) or higher.

The power supply voltage switch controller 131 includes a circuit (referred to herein as the supply controller) 141 for setting the power supply voltage switch 130 at the conductive state, and a circuit (referred to herein as the cutoff controller) 142 for setting the power supply voltage switch 130 at the nonconductive state.

The supply controller 141 sets the power supply voltage switch 130 at the conductive state in the output mode so as to supply the power supply voltage VDD to the pre-driver 111.

The supply controller 141 includes a PMOS transistor P2 and NMOS transistors N2 and N7. The PMOS transistor P2 and the NMOS transistor N2 form an inverter and are connected in series between the power supply voltage VDD and the ground. The gate electrodes of the NMOS transistor N2 and the PMOS transistor P2 forming the inverter are supplied with OEB signals. The drain of the PMOS transistor P2 (NMOS transistor N2) which serves as the output of the inverter is connected to the gate of the NMOS transistor N7.

The drain of the NMOS transistor N7 is connected to the gate electrode of the power supply voltage switch 130, which is the node 4 being the output terminal of the power supply voltage switch controller 131), and the source of the NMOS transistor N7 is grounded.

In the supply controller 141, since the OEB signal is Low level in the output mode, the NMOS transistor N7 becomes conductive by the inverter of the PMOS transistor P2 and the NMOS transistor N2. Since the NMOS transistor N7 is conductive, the gate of the PMOS transistor P9 is supplied with the ground voltage. The power supply voltage switch 130 thereby becomes conductive. On the other hand, since the OEB signal is High level in the input mode, the NMOS transistor N7 becomes nonconductive. The supply controller 141 thus does not supply the ground voltage to the gate of the PMOS transistor P9.

The cutoff controller 142 sets the power supply voltage switch 130 at the nonconductive state when a voltage of (VDD−|Vt|) or higher is applied to the I/O terminal during the input mode, so as to block the connection between the power supply voltage VDD and the pre-driver 111. The cutoff controller 142 is a switch composed of a pair of the NMOS transistor N8 and the PMOS transistor P8. The source of the NMOS transistor N8 and the source of the PMOS transistor P8 are connected to the output of the power supply voltage switch controller 131, which is the node 4. The drain of the NMOS transistor N8 and the drain of the PMOS transistor P8 are connected the line which connects the I/O terminal and the input buffer 102.

The gate of the NMOS transistor N8 is supplied with the OEB signal. In the output mode, the OEB signal is Low level, and the NMOS transistor N8 is nonconductive. Thus, a power supply voltage or the like is not applied to the gate of the PMOS transistor P9. In the input mode, on the other hand, the OEB signal is High level, and the NMOS transistor N8 is conductive. The drain of the PMOS transistor P8 is connected to the line which connects the I/O terminal (node 1) and the input buffer 102, and the gate of the PMOS transistor P8 is connected to the power supply voltage VDD. The PMOS transistor P8 becomes conductive when the voltage of (VDD+|Vt|) or higher is applied to the I/O terminal by reversal of the source and the drain. Thus, the cutoff controller 142 supplies the voltage input to the I/O terminal to the gate of the PMOS transistor P9 in the input mode.

The I/O terminal voltage transfer 132 is composed of the PMOS transistor P7 in the first embodiment. The source of the PMOS transistor P7 is connected to the node 3 and the drain is connected to the I/O terminal. The gate of the PMOS transistor P7 is connected to the power supply voltage VDD. In the output mode, the PMOS transistor P7 is nonconductive. In the input mode and when the voltage of (VDD+|Vt|) or higher is applied to the I/O terminal, the PMOS transistor P7 becomes conductive by reversal of the source and the drain.

The voltage input to the I/O terminal is thereby supplied to the source of the PMOS transistor P4 of the pre-driver 111 which is connected to the node 3.

The operation of the buffer circuit 100 of the first embodiment is described herein in detail in each of the output mode and the input mode.

The case where the buffer circuit 100 is in the output mode is described firstly. In the output mode, the OEB signal is Low level, and the DATA signal is supplied from the internal circuit. Since the OEB signal is Low level, the gate voltage at the PMOS transistor P9 of the power supply circuit 114 is the ground voltage. The PMOS transistor P9 thereby becomes conductive, and the voltage at the output of the power supply circuit 114 or the node 3 is the power supply voltage VDD. The PMOS transistors P7 and P8 and the NMOS transistor N8 are nonconductive.

Since the OEB signal is Low level, the 3-state controller 110 outputs the signal of the same logic as the DATA signal from the OUTP terminal and the OUTN terminal. The OUTP signal is input to the pre-driver 111. The pre-driver 111 drives the PMOS transistor P1 of the output stage 113 by the inverted OUTP signal. At this time, the source of the PMOS transistor P4 of the pre-driver 111 is supplied with the power supply voltage VDD from the power supply circuit 114. The OUTN signal is input to the pre-driver 112. The pre-driver 112 drives the NMOS transistor N1 of the output stage 113 by the inverted OUTN signal. The output stage 113 outputs the signals inverted from the inverted OUTP signal and the inverted OUTN signal through the node 1. Thus, the output stage 113 outputs the signal of the same logic as the DATA signal from the node 1.

In the output mode, the N-well controller 116 connects the N-well of the PMOS transistors P1, P4 and P6 to P10 to the power supply voltage VDD if the output signal is Low level. If the output signal if High level, on the other hand, the N-well controller 116 blocks the connection between the N-well of the PMOS transistors P1, P4 and P6 to P10 and the power supply voltage VDD.

The case where the buffer circuit 100 is in the input mode is described next. In the input mode, the OEB signal is High level, and the OUTP terminal of the 3-state controller 110 is Low level regardless of the DATA signal, and the OUTN terminal of the 3-state controller 110 is High level regardless of the DATA signal. The PMOS transistor P1 and the NMOS transistor N1 of the output stage 113 thereby become nonconductive, setting the node 1 at the high impedance state.

If the signal of the ground voltage (Low level) is input to the I/O terminal, the input signal is supplied to the inverter 121 through the level shifter 120. Thus, the signal of the power supply voltage VDD (High level) is transmitted to the internal circuit.

The NMOS transistor N8 of the power supply circuit 114 is conductive. Thus, the ground voltage is supplied to the power supply voltage switch 130 through the line between the I/O terminal and the input buffer 102, and the transistor N8. The power supply circuit 114 supplies the power supply voltage VDD to the pre-driver 111. The N-well controller 116 is conductive because of the ground voltage input to the I/O terminal and supplies the power supply voltage VDD to the N-well of the PMOS transistors P1, P4 and P6 to P10.

If the signal corresponding to the power supply voltage VDD is input to the I/O terminal, the voltage of the input signal becomes corresponding to the power supply voltage VDD at the terminal of the level shifter 120 on the side of the inverter 121, and this voltage is supplied to the inverter 121. The signal of Low level is thereby transmitted to the internal circuit.

Since the NMOS transistor N8 of the power supply circuit 114 is conductive, the power supply voltage switch 130 is supplied with the voltage corresponding to the power supply voltage VDD and becomes nonconductive. The power supply circuit 114 thereby blocks the supply of the power supply voltage VDD to the pre-driver 111. Since the voltage at the I/O terminal is the voltage corresponding to the power supply voltage VDD, the N-well controller 116 is nonconductive and blocks the supply of the power supply voltage VDD to the N-well area of the PMOS transistors P1, P4 and P6 to P10.

If the signal of an external power supply voltage (e.g. 5.0V) is input to the I/O terminal, the voltage of the input signal becomes (VDD+|Vth|) at the terminal of the level shifter 120 on the side of the inverter 121, and this voltage is supplied to the inverter 121. The signal of Low level is thereby transmitted to the internal circuit.

Further, since the NMOS transistor N8 and the PMOS transistor P8 of the power supply circuit 114 are conductive, the power supply voltage switch 130 is supplied with an external power supply voltage and thus becomes nonconductive. The connection between the pre-driver 111 and the power supply voltage VDD is thereby blocked. At this time, since the I/O terminal voltage transfer 132 (PMOS transistor P7) of the power supply circuit 114 is conductive, and the power supply circuit 114 supplies the voltage at the I/O terminal (e.g. external power supply voltage) to the pre-driver 111. Further, since the gate controller 115 (PMOS transistor P6) is conductive, the output of the pre-driver 111 (node 2) equals the external power supply voltage, and therefore the gate voltage of the PMOS transistor P1 in the output stage 113 also equals the external power supply voltage. Since the voltage of the I/O terminal equals the external power supply voltage, the N-well controller 116 is nonconductive and blocks the supply of the power supply voltage VDD to the N-well of the PMOS transistors P1, P4 and P6 to P10.

In the buffer circuit 100 of the first embodiment, in the input mode and upon input of an external power supply voltage which is higher than the power supply voltage VDD of the buffer circuit 100, the source and drain of the PMOS transistor P1 of the output stage 113 are reversed to become conductive. In order to prevent a current from flowing back to the PMOS transistor P1, the PMOS transistor P6 supplies the external power supply voltage to the gate of the PMOS transistor P1. The power supply circuit 114 blocks the connection between the pre-driver 111 of the output buffer 101 and the power supply voltage VDD. Therefore, even if an external power supply voltage which is higher than the power supply voltage VDD is input to the buffer circuit 100, since the connection between the pre-driver 111 and the power supply voltage VDD is blocked, it is possible to prevent a current from flowing into the power supply voltage VDD through the I/O terminal, the PMOS transistor P6 and the pre-driver 111. Further, the N-well controller 116 blocks the connection between the N-well of the PMOS transistors P1, P4 and P6 to P10 and the power supply voltage VDD when an external power supply voltage which is higher than the power supply voltage VDD is input. It is thereby possible to prevent a current from flowing into the power supply voltage VDD through the N-well areas of the PMOS transistors.

Conventional buffer circuits prevent a current flowing through an I/O terminal, a gate controller and a pre-driver by using a transfer gate. However, the presence of the transfer gate arises the need for delaying the timing to turn the transfer gate to the nonconductive state by using a delay circuit when switching an output stage of the buffer circuit from output mode to a completely high impedance state. It is thus required to design a delay circuit and adjust the timing. On the other hand, the buffer circuit of the first embodiment does not have a transfer gate and thus does not require a delay time, which has been required in relates art, thereby allowing high-speed communication. Further, since the buffer circuit of the first embodiment does not require a transfer gate nor a delay circuit, it can have a small circuit layout area.

Figure 2:
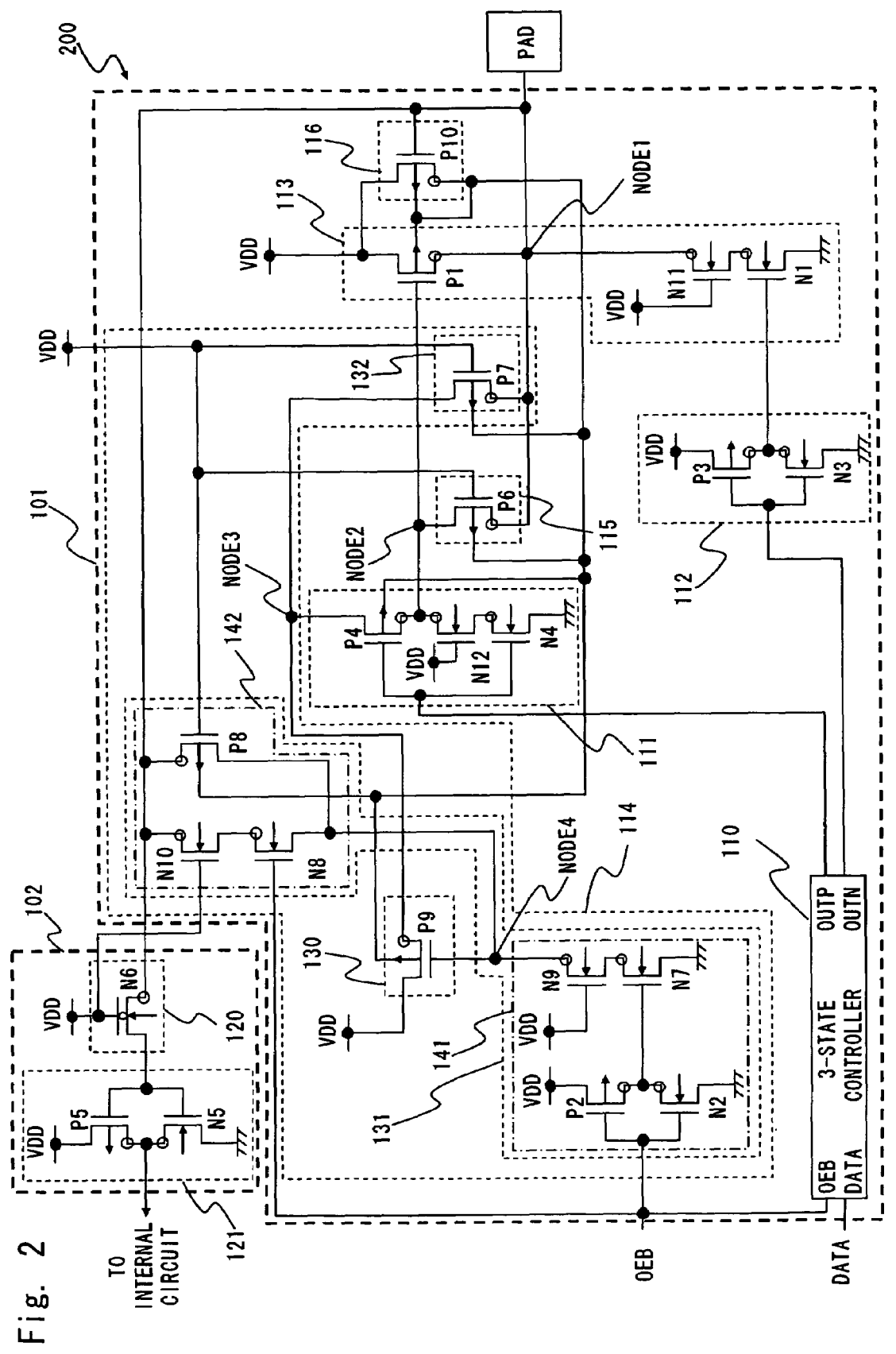

This embodiment may be implemented also when the connection of the devices in the power supply circuit 114 and the gate controller 115 in the buffer circuit 100 is different. FIGS. 2 to 5 show examples with altered connections. The buffer circuit 200 shown in FIG. 2 is implemented by adding NMOS transistors N9, N10, N11 and N12 which serve as overvoltage protection devices to the buffer circuit 100 of FIG. 1. In the case of using a device supplied with a gate-drain voltage, which is problematic in terms of reliability, for a gate oxide film, an overvoltage protection device may be added to protect the NMOS transistor whose drain can be supplied with an external power supply voltage.

The drain of the NMOS transistor which serves as an overvoltage protection device is connected to the node to which the drain of the NMOS transistor to be protected is connected in FIG. 1, the source is connected to the drain of the NMOS transistor to be protected, and the gate is connected to the power supply voltage VDD. In this case, even when a voltage of the power supply voltage VDD or higher is applied to the drain of the NMOS transistor serving as a protection device, the drain voltage of the NMOS transistor N1 is suppressed at VDD−Vt. Therefore, the problematic voltage is not applied to the gate oxide film between the gate and drain of the NMOS transistor to be protected.

In the buffer circuit 200 shown in FIG. 2, the NMOS transistor N9 is connected to the NMOS transistor N7, the NMOS transistor N10 is connected to the NMOS transistor N8, the NMOS transistor N11 is connected to the NMOS transistor N1, and the NMOS transistor N12 is connected to the NMOS transistor N4.

In this connection, the buffer circuit 200 shown in FIG. 2 can receive an input signal with an amplitude of as large as a power supply voltage VDD or larger even when using a device with a low gate oxide film withstand voltage. The buffer circuit 200 of FIG. 2 operates in the same way as the buffer circuit 100 of FIG. 1 since they are different only in the presence of the overvoltage protection devices.

Figure 3:
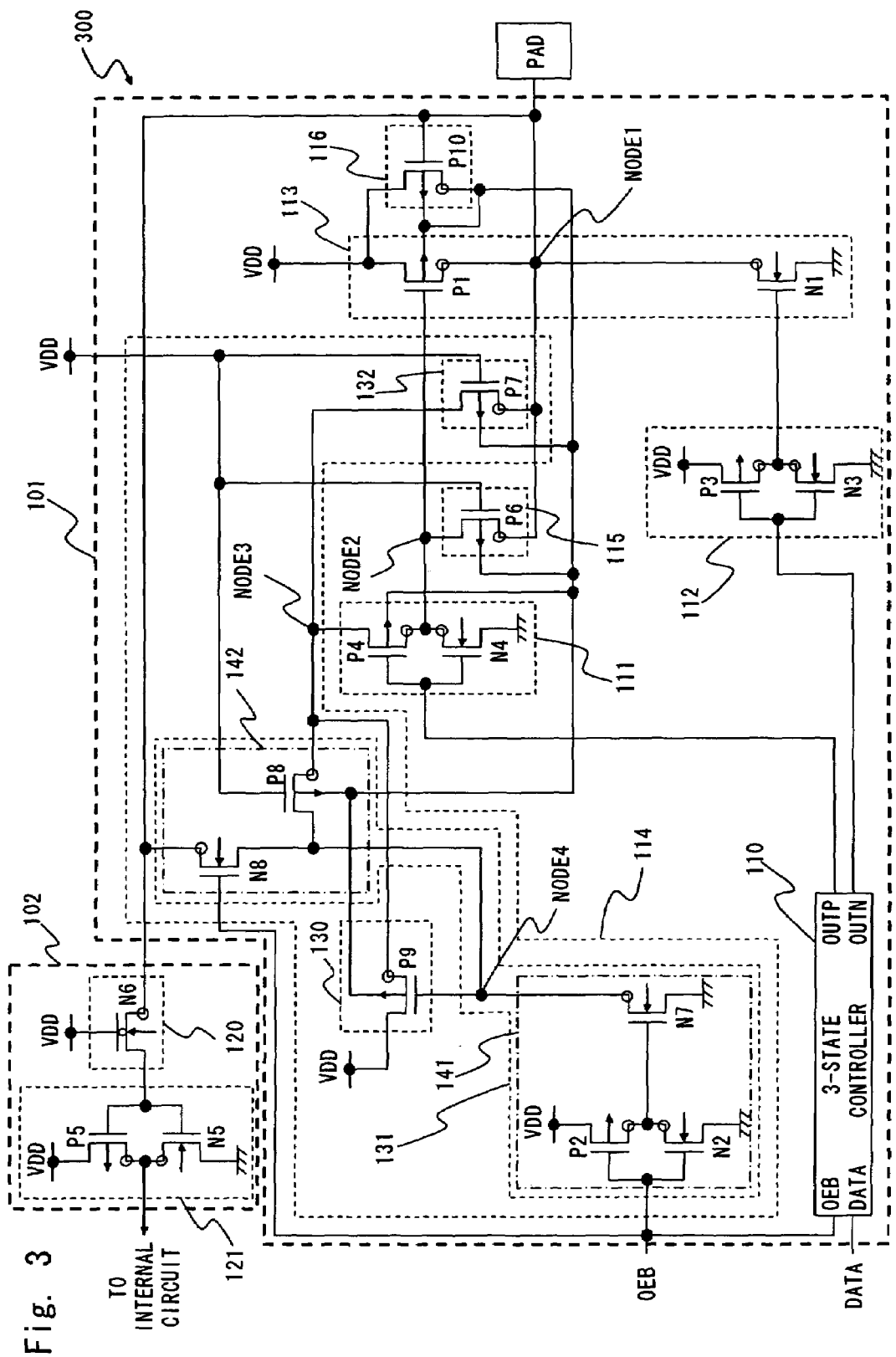
FIG. 3 is a circuit diagram altered from the buffer circuit shown in FIG. 2.

The buffer circuit 300 shown in FIG. 3 is implemented by changing the connection of the PMOS transistor P8 in the power supply circuit 114 in the buffer circuit 100 of FIG. 1. In the buffer circuit 300 of FIG. 3, the gate of the PMOS transistor P8 is connected to the power supply voltage VDD, the source is connected to the source of the NMOS transistor N8, and the drain is connected to the node 3. Upon input of an external power supply voltage, the PMOS transistor P7 supplies the external power supply voltage to the gate of the PMOS transistor P9 through the PMOS transistor P8, thereby setting the PMOS transistor P9 at the nonconductive state. The connection between the pre-driver 111 and the power supply voltage VDD is thus blocked, and it is thereby possible to prevent a current flowing from the I/O terminal to the power supply voltage VDD through the pre-driver 111. Hence, the buffer circuit 300 of FIG. 3 has the same effect as the buffer circuit 100 of FIG. 1.

Figure 4:
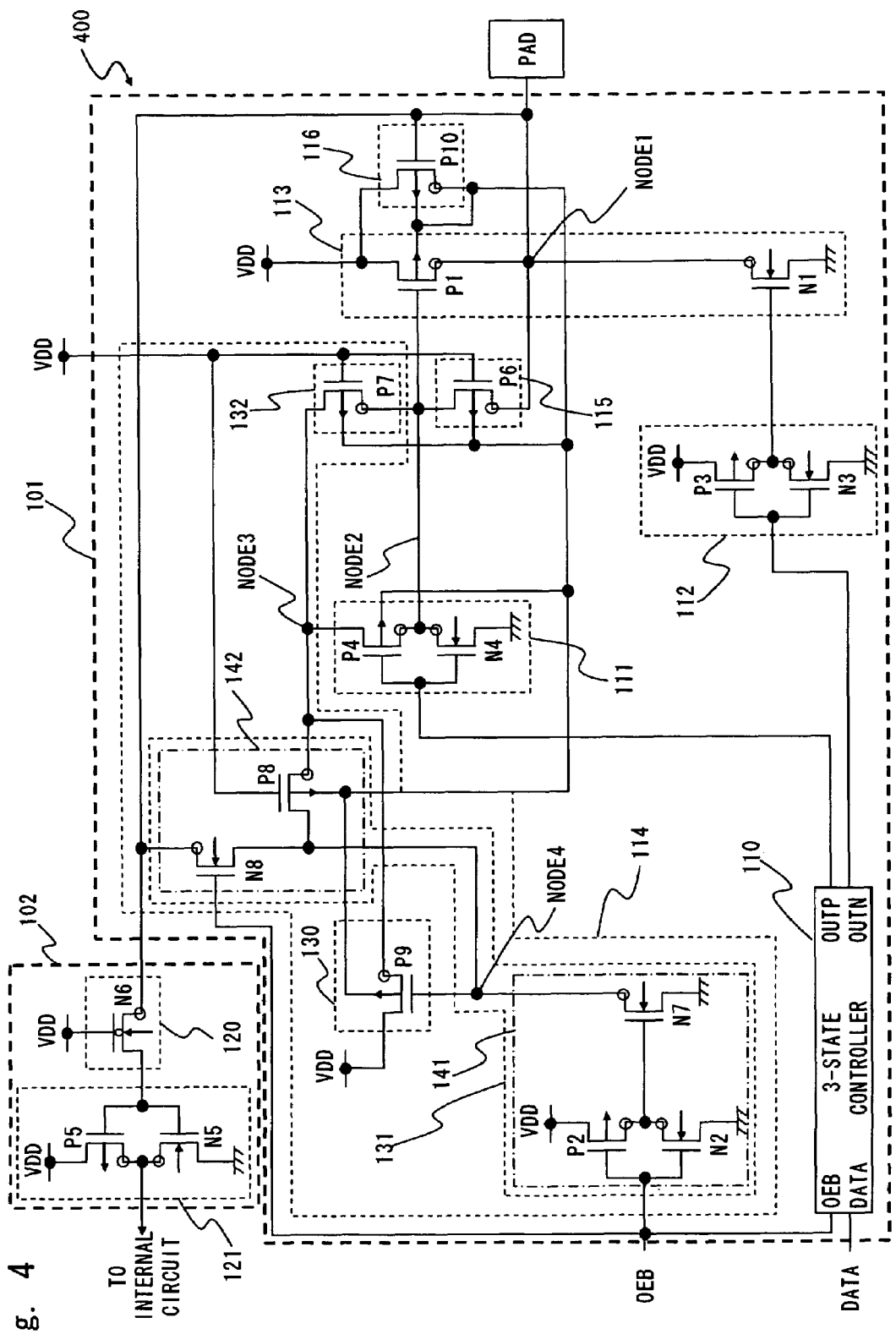
FIG. 4 is a circuit diagram altered from the buffer circuit shown in FIG. 3.

The buffer circuit 400 shown in FIG. 4 is implemented by changing the connection of the PMOS transistor P7 in the buffer circuit 300 of FIG. 3. In the buffer circuit 400 of FIG. 4, the gate of the PMOS transistor P7 is connected to the power supply voltage VDD, the source is connected to the node 3, and the drain is connected to the source of the PMOS transistor P6. In this configuration, the external power supply voltage is supplied to the gate of the PMOS transistor P9 through the I/O terminal, the gate controller 115 and the PMOS transistors P7 and P8. The PMOS transistor P9 is thereby nonconductive. The connection between the pre-driver 111 and the power supply voltage VDD is thus blocked, and it is thereby possible to prevent a current flowing from the I/O terminal to the power supply voltage VDD through the pre-driver 111. Hence, the buffer circuit 400 of FIG. 4 has the same effect as the buffer circuit 100 of FIG. 1.

Figure 5:
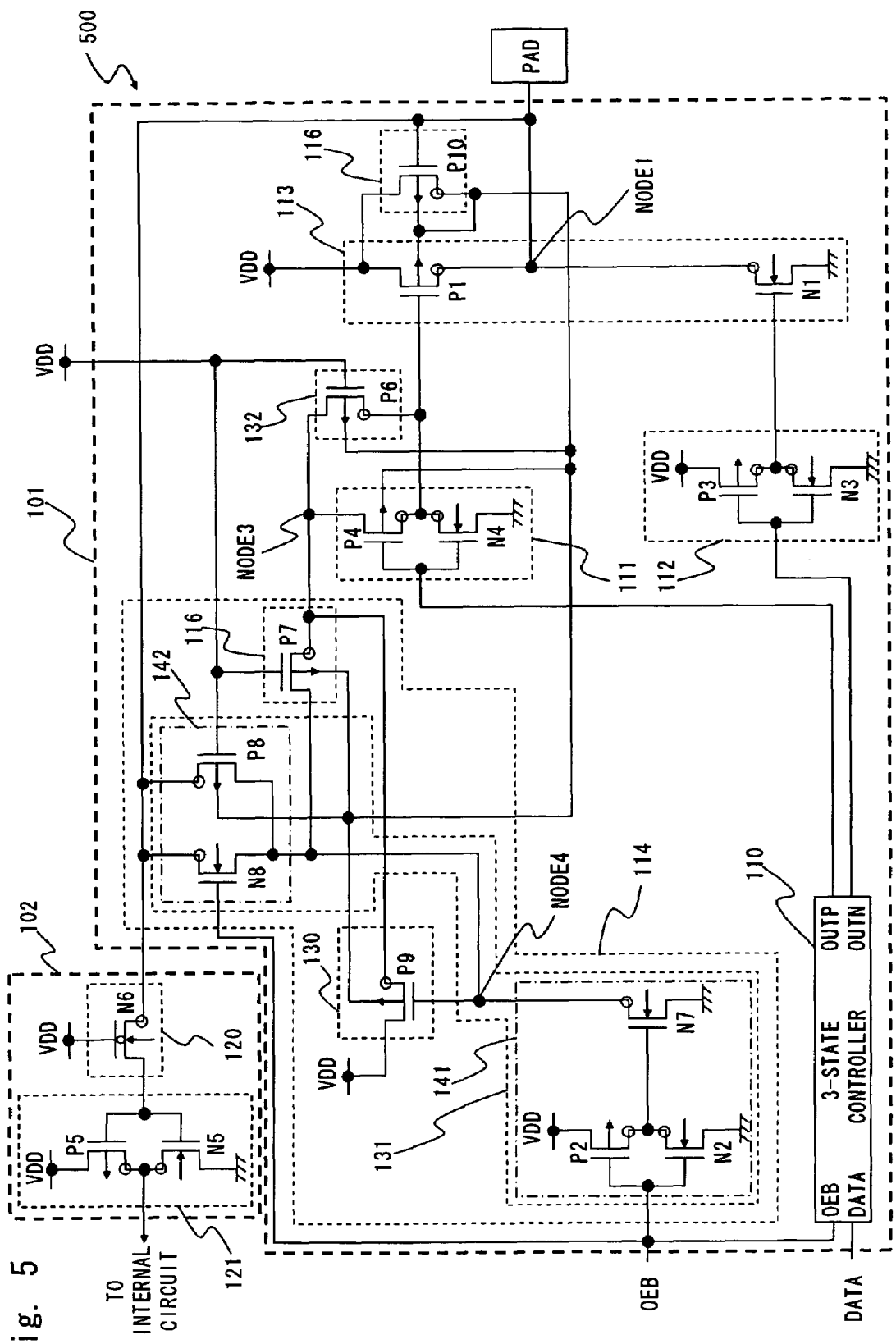
FIG. 5 is a circuit diagram altered from the buffer circuit shown in FIG. 2.

The buffer circuit 500 shown in FIG. 5 is implemented by changing the connection of the PMOS transistors P6 and P7 in the buffer circuit 100 of FIG. 1. In the buffer circuit 500 of FIG. 5, the gate of the PMOS transistor P7 is connected to the power supply voltage VDD, the source is connected to the sources of the NMOS transistor N8 and the PMOS transistor P8, and the drain is connected to the node 3. The gate of the PMOS transistor P6 is connected to the power supply voltage VDD, the source is connected to the node 3, and the drain is connected to the gate of the PMOS transistor P1 in the output stage 113, which is the node 2. In this configuration, the external power supply voltage is supplied to the gate of the PMOS transistor P9 through the I/O terminal, the NMOS transistor N8 and the PMOS transistors P8. Further, the external power supply voltage is supplied to the drain of the PMOS transistor P9 through the PMOS transistor P7. The PMOS transistor P9 is thereby nonconductive. The connection between the pre-driver 111 and the PMOS transistor P9 is thus blocked, and it is thereby possible to prevent a current flowing from the I/O terminal to the power supply voltage VDD. Further, the external power supply voltage is supplied to the gate of the PMOS transistor P1 through the supply controller 141 and the PMOS transistors P7 and P6. It is thereby possible to prevent a current flowing to the power supply voltage VDD. Hence, the buffer circuit 500 of FIG. 5 has the same effect as the buffer circuit 100 of FIG. 1.

Second Embodiment

Figure 6:
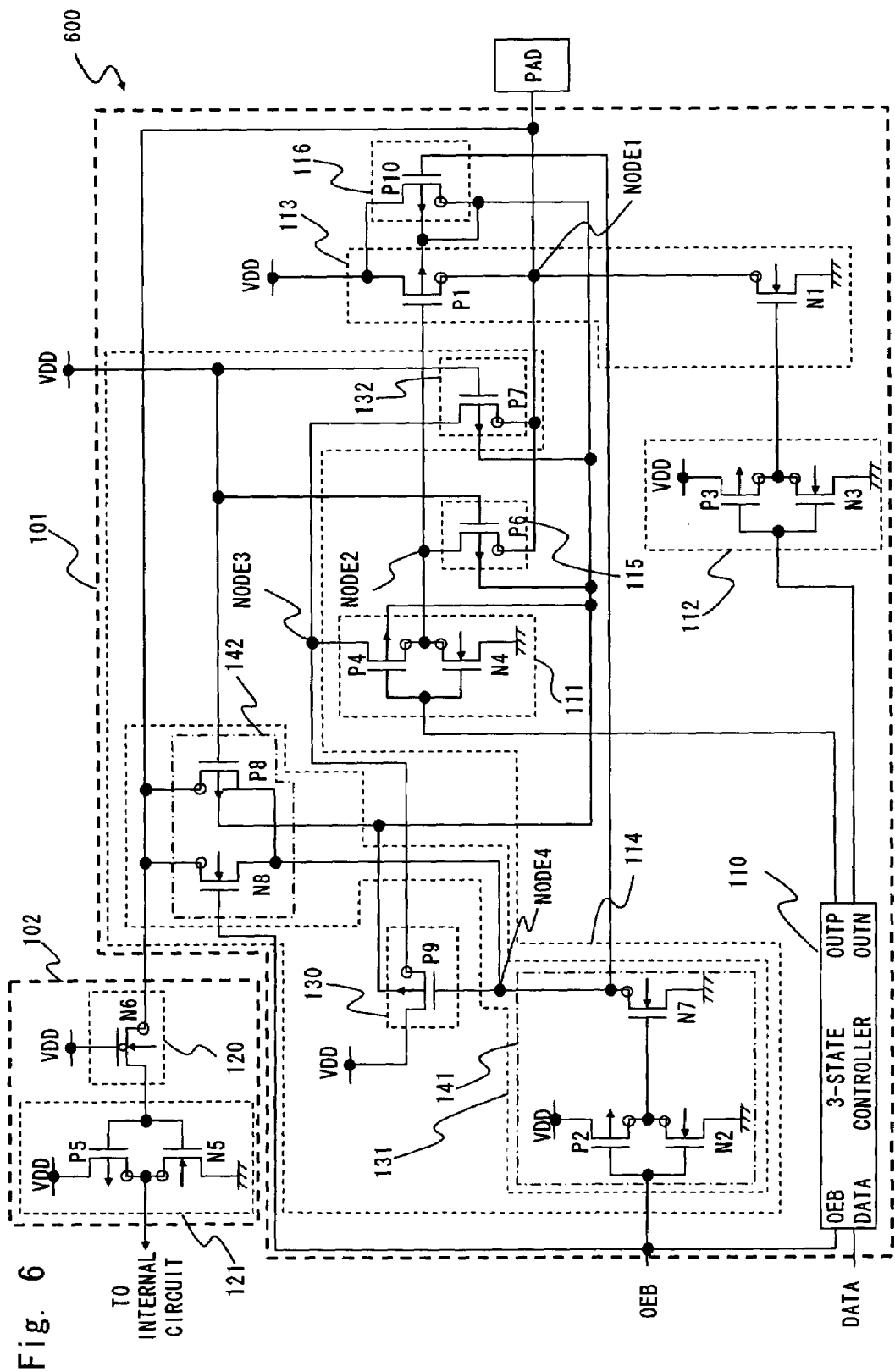
FIG. 6 is a circuit diagram of a buffer circuit according to a second embodiment of the present invention.

FIG. 6 is the circuit diagram of a buffer circuit 600 according to a second embodiment of the present invention. The buffer circuit 600 of the second embodiment is substantially the same circuit as the buffer circuit 100 of the first embodiment. The buffer circuit 600 of the second embodiment is different from the buffer circuit 100 of the first embodiment in the connection of the gate of the PMOS transistor P10 in the N-well controller 116. The same elements as in the buffer circuit 100 of the first embodiment are denoted by the same reference numerals and not described in detail herein.

The gate of the PMOS transistor P10 is connected to the I/O terminal in the buffer circuit 100 of the first embodiment. In the buffer circuit 600 of the second embodiment, the gate of the PMOS transistor P10 is connected to the line which connects the NMOS transistor N7 and the PMOS transistor P9 of the power supply circuit 114.

In this connection, when the buffer circuit 600 is in the output mode, the N-well controller 116 can constantly connect the N-well of the PMOS transistors P1, P4 and P6 to P10 to the power supply voltage VDD. The PMOS transistor changes its device characteristics depending on the voltage of the N-well area. Specifically, the PMOS transistor has the characteristics that the driving capacity is low when the voltage of the N-well is higher than the power supply voltage VDD. Thus, making a constant connection between the N-well and the power supply voltage VDD during the output mode allows the characteristics of the PMOS transistor to be in stable and ideal state.

When the buffer circuit 600 is in the input mode, on the other hand, the N-well controller 116 connects the N-well to the power supply voltage VDD before the external power supply voltage reaches VDD−|Vt| and it blocks the connection between the N-well of the PMOS transistors P1, P4 and P6 to P10 and the power supply voltage VDD after the external power supply voltage reaches VDD−|Vt|.

During the output mode, if the gate of the PMOS transistor P10 is connected to the I/O terminal, upon switching of the voltage level input to the I/O terminal from Low level to High level, a voltage higher than the power supply voltage is applied to the N-well due to the parasitic coupling capacitance between the gate and drain of the PMOS transistor P10. The applied voltage can causes the deterioration of the gate oxide film of the PMOS transistor. However, in the buffer circuit 600 of the second embodiment, since the gate of the PMOS transistor P10 is connected to the line which connects the NMOS transistor N7 and the PMOS transistor P9, in no case the high voltage is applied to the N-well area. It is thereby possible to increase the reliability of the device. The driving capacity does not decrease thereby.

Figure 7:
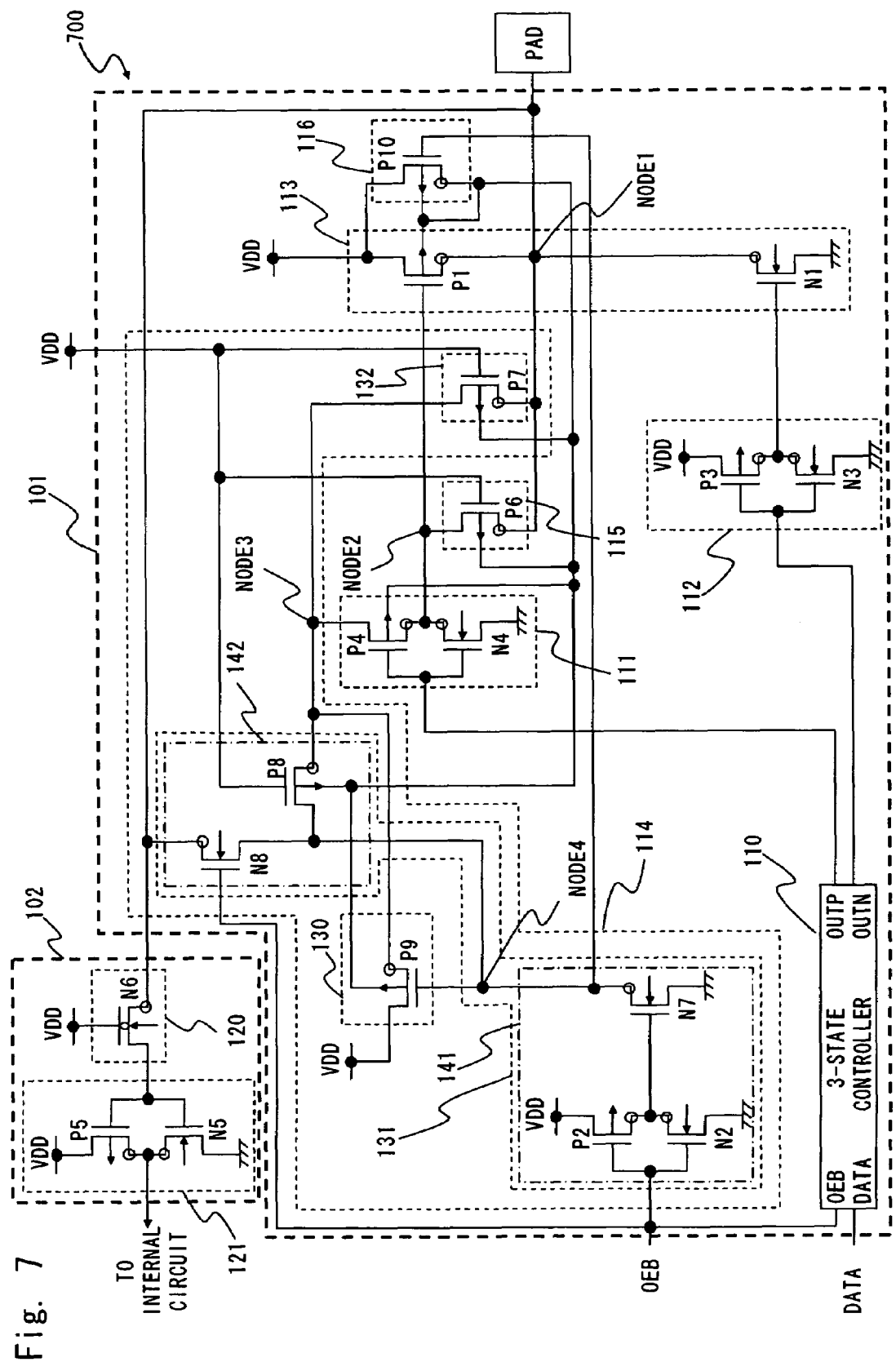
FIG. 7 is a circuit diagram where the alternation according to the second embodiment is made to the buffer circuit of FIG. 3.
Figure 8:
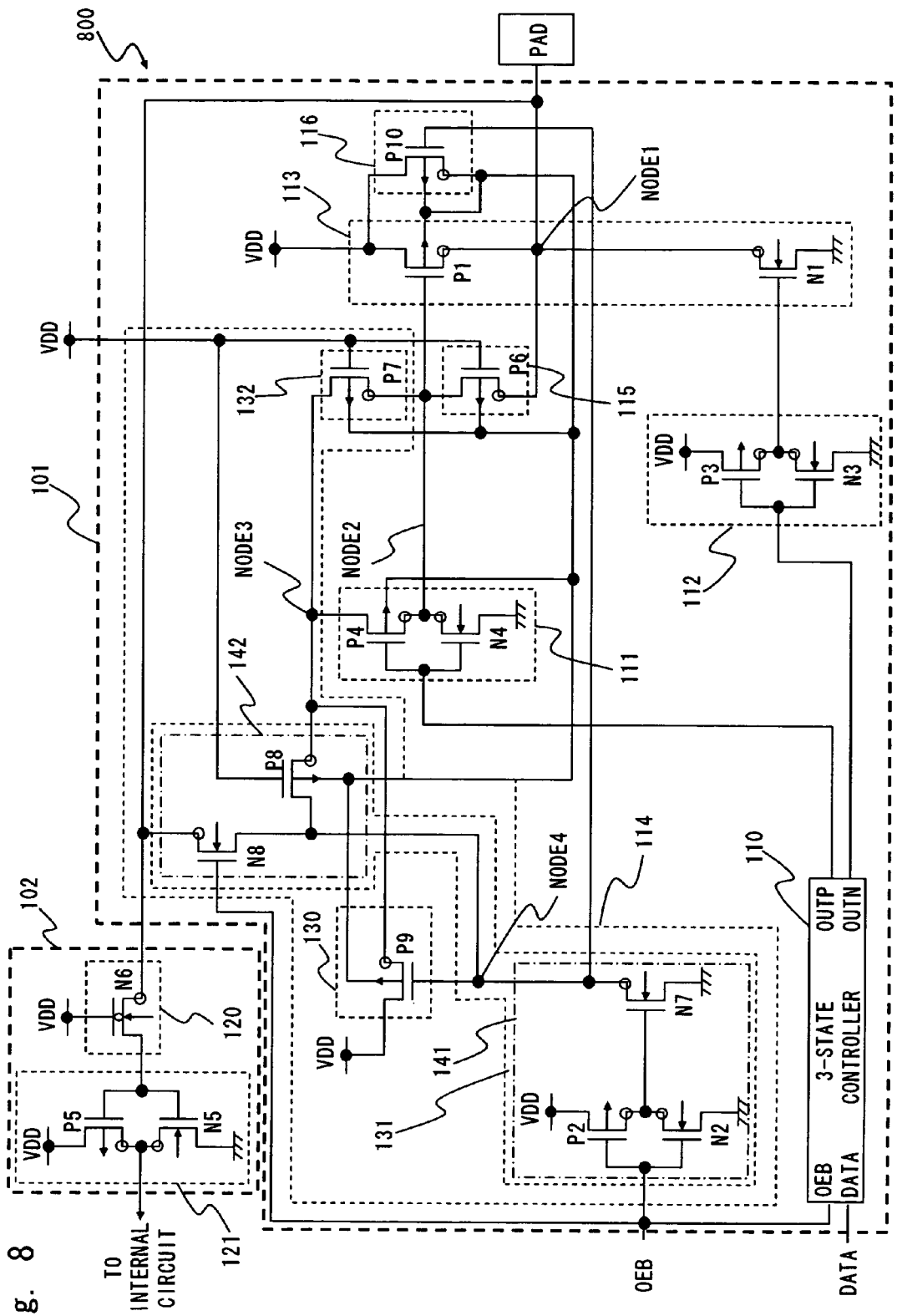
FIG. 8 is a circuit diagram where the alternation according to the second embodiment is made to the buffer circuit of FIG. 4.

The buffer circuit 600 of the second embodiment may be also altered in the similar way as in the first embodiment. FIGS. 7 and 8 show altered embodiments of the buffer circuits of FIGS. 3 and 4. The buffer circuit 700 shown in FIG. 7 is basically the same as the buffer circuit 300 shown in FIG. 3 but different in that the gate of the PMOS transistor P10 is connected to the line which connects the NMOS transistor N8 and the PMOS transistor P9. Since simply the same connection change as in the buffer circuit 600 of FIG. 6 is made to the buffer circuit 300 of FIG. 3, the buffer circuit 700 has the same effect as the buffer circuit 600.

The buffer circuit 800 shown in FIG. 8 is basically the same as the buffer circuit 400 shown in FIG. 4 but different in that the gate of the PMOS transistor P10 is connected to the line which connects the NMOS transistor N7 and the PMOS transistor P9. Since simply the same connection change as in the buffer circuit 600 of FIG. 6 is made to the buffer circuit 400 of FIG. 4, the buffer circuit 800 has the same effect as the buffer circuit 600.

Third Embodiment

Figure 9:
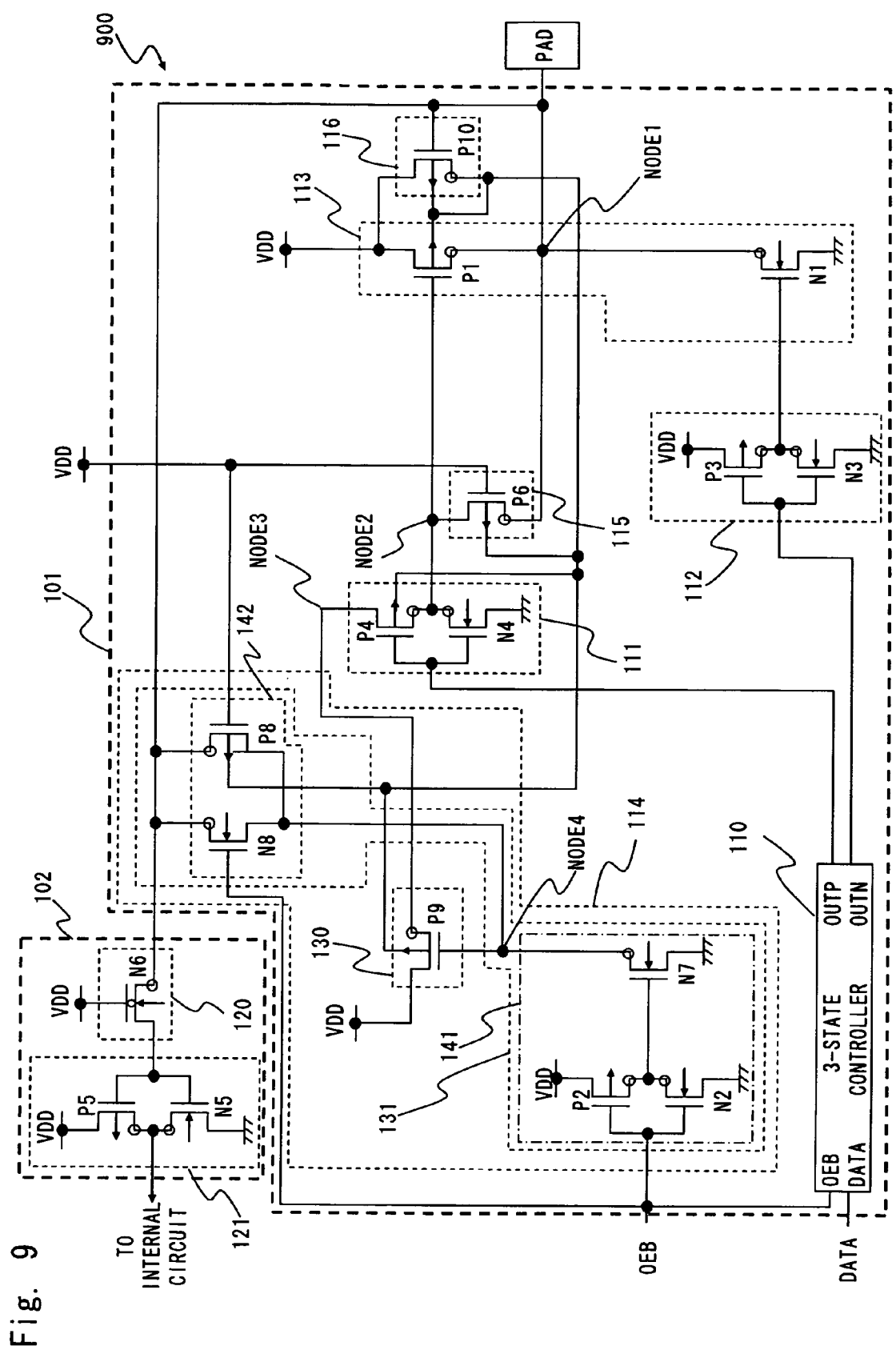
FIG. 9 is a circuit diagram of a buffer circuit according to a third embodiment of the present invention.

FIG. 9 is the circuit diagram of a buffer circuit 900 according to a third embodiment of the present invention. The buffer circuit 900 of the third embodiment is substantially the same circuit as the buffer circuit 100 of the first embodiment. The buffer circuit 900 of the third embodiment is different from the buffer circuit 100 of the first embodiment only in that the PMOS transistor P7 is eliminated. The same elements as in the buffer circuit 100 of the first embodiment are denoted by the same reference numerals and not described in detail herein.

The buffer circuit 900 of the third embodiment does not have the PMOS transistor P7. However, upon input of an external power supply voltage to the I/O terminal, the external power supply voltage is supplied to the gate of the PMOS transistor P9 by the NMOS transistor N8 and the PMOS transistor P8. Since the connection between the pre-driver 111 and the power supply voltage VDD is thereby blocked, it is possible to prevent a current flowing to the power supply voltage VDD through the I/O terminal, PMOS transistor P6 and the pre-driver 111 (PMOS transistor P4).

Since the gate voltage of the PMOS transistor P1 equals the external power supply voltage due to the PMOS transistor P6, it is also possible to prevent a current flowing to the power supply voltage VDD through the PMOS transistor P1.

Hence, the buffer circuit 900 of the third embodiment has the same effect as the buffer circuit 100 of the first embodiment. Since the buffer circuit 900 of the third embodiment eliminates the PMOS transistor P7, it is possible to simplify the circuit and reduce the layout area compared with the buffer circuit 100 of the first embodiment.

The buffer circuit 900 of the third embodiment may be also altered in the such ways as shown in FIGS. 2 and 5 in the first embodiment. It is feasible to connect the gate of the PMOS transistor P10 to the line which connects the NMOS transistor N8 and the PMOS transistor P9. The buffer circuit 900 thereby has the same effect as in the second embodiment.

Fourth Embodiment

Figure 11:
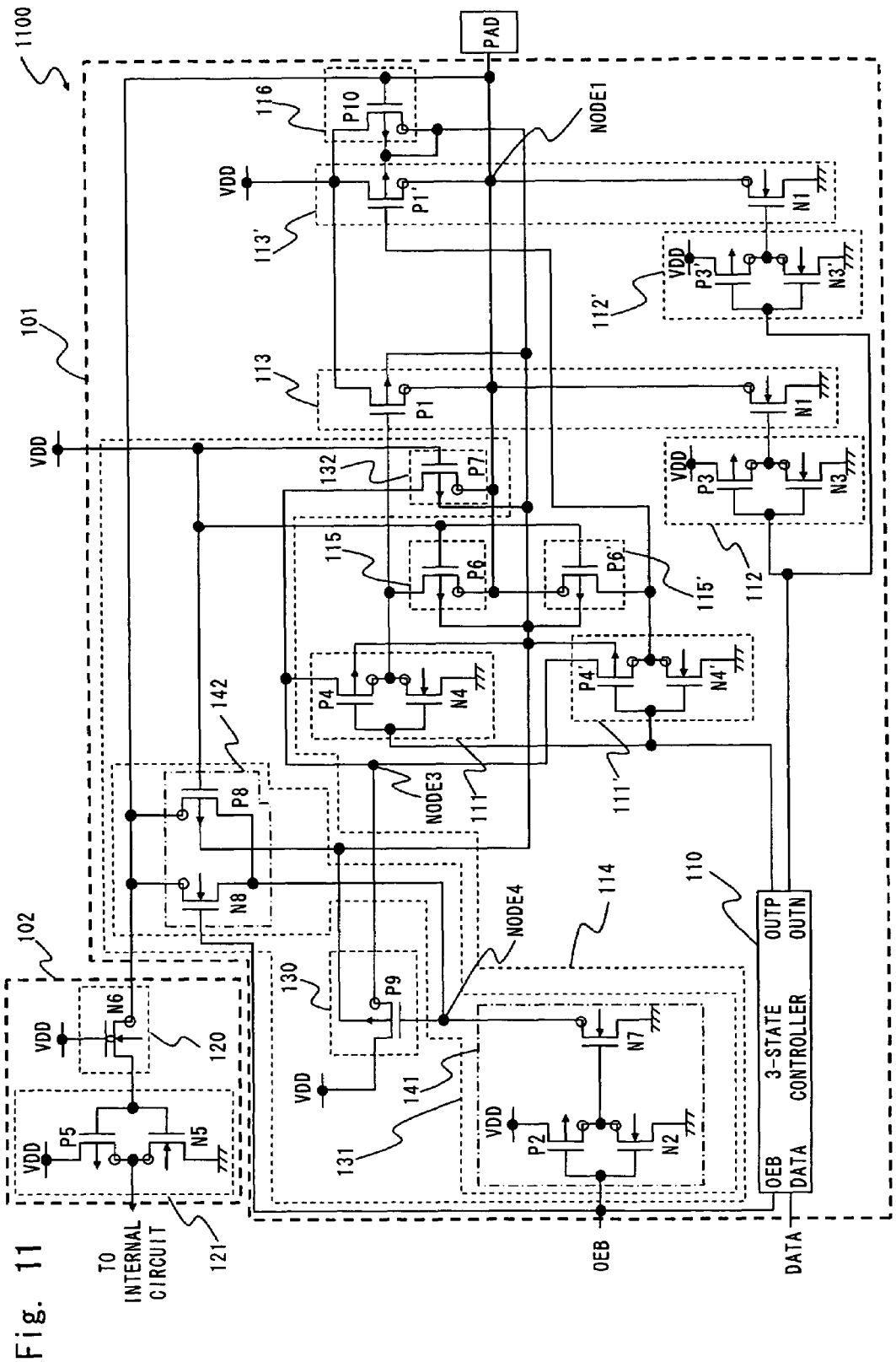
FIG. 11 is a circuit diagram of a buffer circuit according to a fifth embodiment of the present invention.
Figure 12:
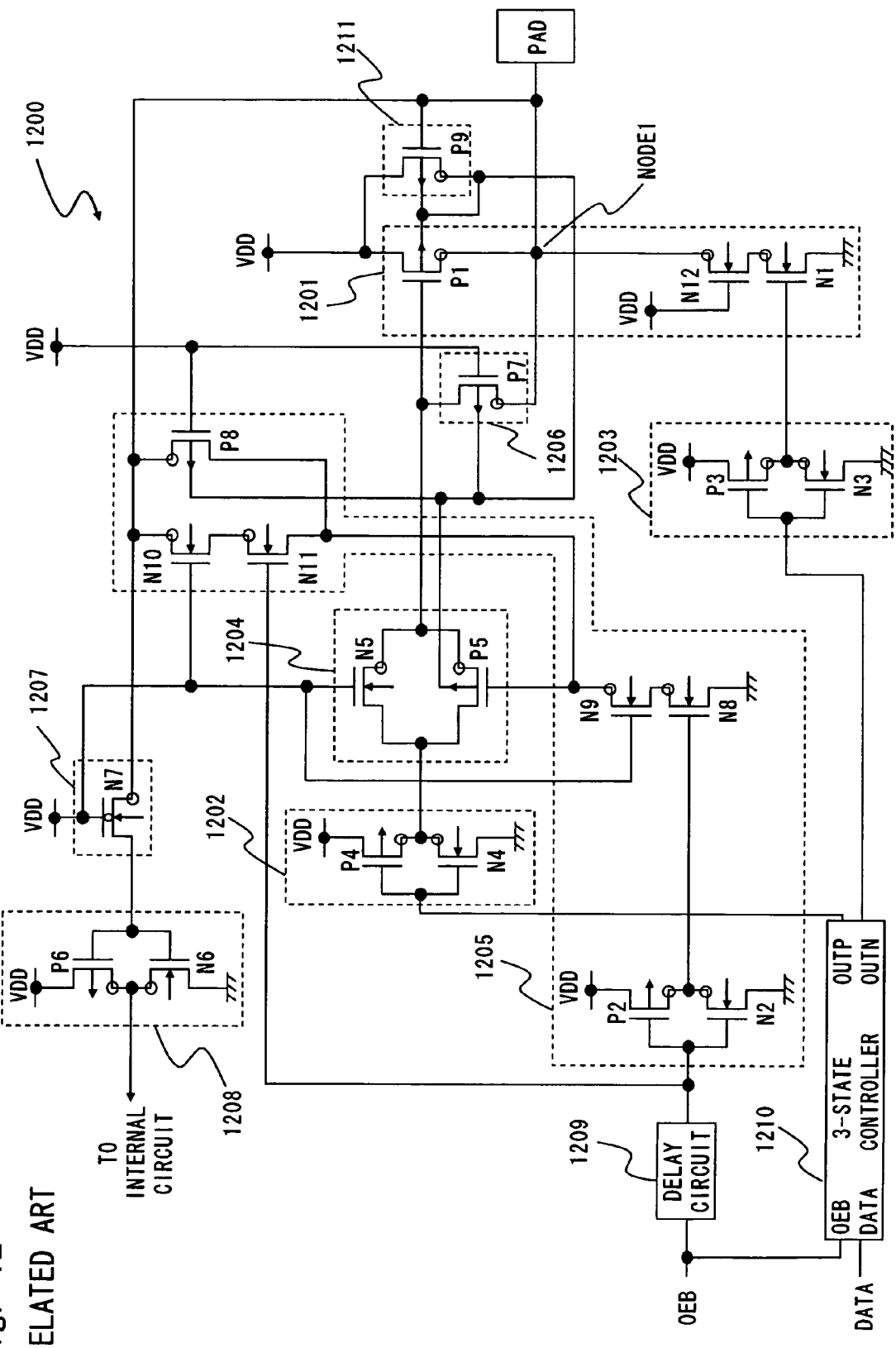
FIG. 12 is a circuit diagram of a buffer circuit of a related art.

FIG. 11 is the circuit diagram of a buffer circuit 1000 according to a fourth embodiment of the present invention. The buffer circuit 1000 of the fourth embodiment is substantially the same circuit as the buffer circuit 100 of the first embodiment. The buffer circuit 1000 of the fourth embodiment is different from the buffer circuit 100 of the first embodiment only in that the PMOS transistor P6 is eliminated. The same elements as in the buffer circuit 100 of the first embodiment are denoted by the same reference numerals and not described in detail herein.

The buffer circuit 1000 of the fourth embodiment does not have the PMOS transistor P6. The current path to flow into the power supply voltage VDD through the I/O terminal, the PMOS transistor P6 and the pre-driver 111 is thereby eliminated. The external power supply voltage is supplied to the gate of the PMOS transistor P1 through the I/O terminal, the PMOS transistor P7 and the pre-driver 111 (PMOS transistor P4). It is thereby possible to prevent a current flowing to the power supply voltage VDD through the PMOS transistor P1.

Further, upon input of an external power supply voltage to the I/O terminal, the external power supply voltage is supplied to the gate of the PMOS transistor P9 by the PMOS transistor P8. Since the connection between the I/O terminal and the power supply voltage VDD is thereby blocked, it is possible to prevent a current flowing to the power supply voltage VDD through the I/O terminal and the PMOS transistor P7.

Hence, the buffer circuit 1000 of the fourth embodiment has the same effect as the buffer circuit 100 of the first embodiment. Since the buffer circuit 1000 of the fourth embodiment eliminates the PMOS transistor P6, it is possible to simplify the circuit and reduce the layout area compared with the buffer circuit 100 of the first embodiment.

The buffer circuit 1000 of the fourth embodiment maybe also altered in the such ways as shown in FIGS. 2 and 3 in the first embodiment. It is feasible to connect the gate of the PMOS transistor P10 to the line which connects the NMOS transistor N8 and the PMOS transistor P9. The buffer circuit 1000 thereby has the same effect as in the second embodiment.

Fifth Embodiment

Figure 10:
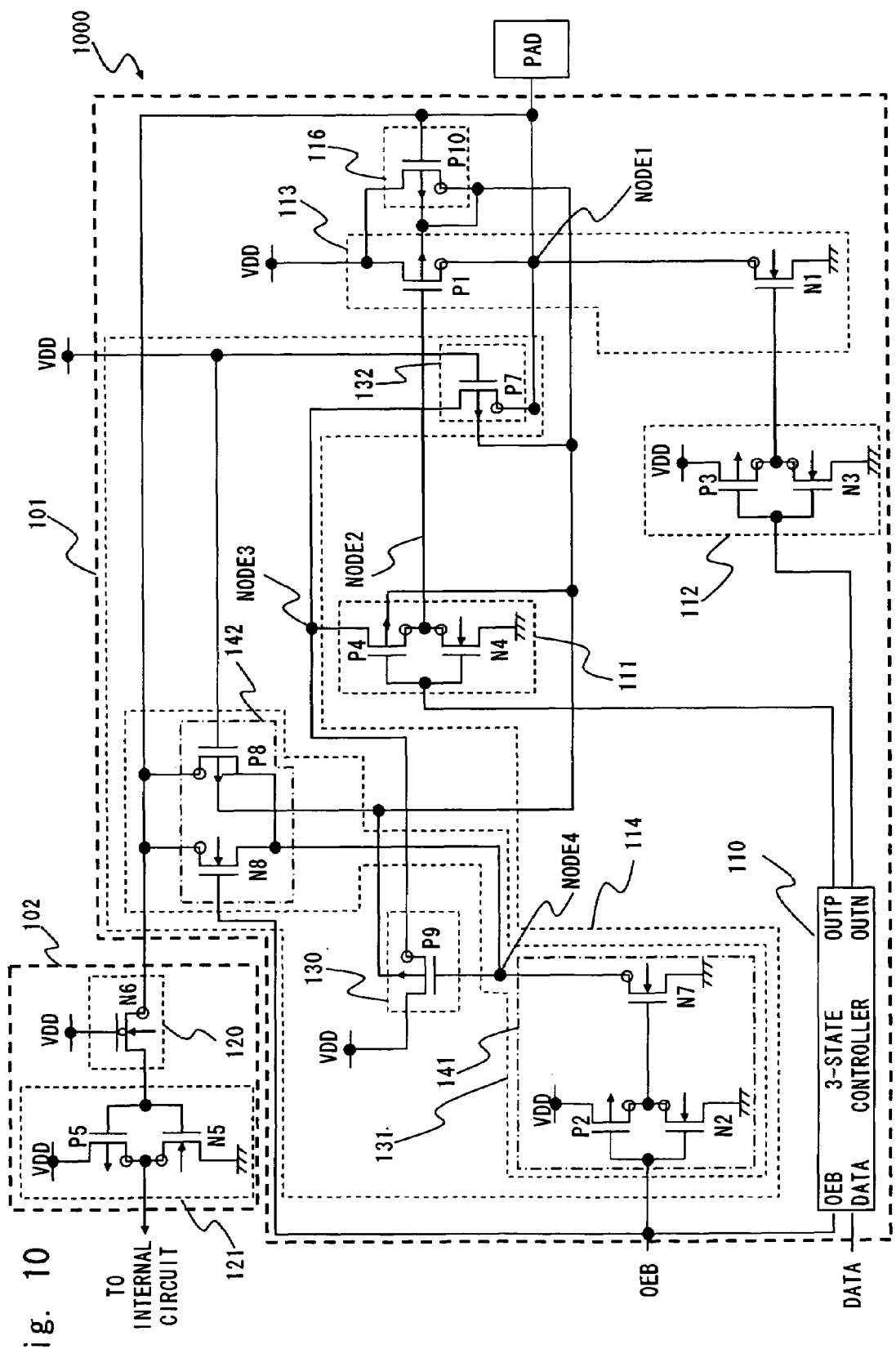
FIG. 10 is a circuit diagram of a buffer circuit according to a fourth embodiment of the present invention.

FIG. 10 is the circuit diagram of a buffer circuit 1100 according to a fifth embodiment of the present invention. The buffer circuit 1100 of the fifth embodiment operates in substantially the same way as the buffer circuit 100 of the first embodiment. The buffer circuit 1100 of the fifth embodiment is different from the buffer circuit 100 of the first embodiment in that the output stage, the pre-driver and the gate controller are respectively formed in two stages. The same elements as in the buffer circuit 100 of the first embodiment are denoted by the same reference numerals and not described in detail herein.

The buffer circuit 1100 of the fifth embodiment has pre-drivers 111' and 112', a gate controller 115' and an output stage 113' which have the same configuration as the pre-drivers 111 and 112, the gate controller 115 and the output stage 113, respectively. The connection of the pre-drivers 111' and 112', the gate controller 115' and the output stage 113' are the same as in the first embodiment. In the buffer circuit 1100, the output stages 113 and 113' are connected in parallel and generates an output signal with one stage or two stages according to the necessary driving capacity.

The buffer circuit 1100 of the fifth embodiment may have the same power supply circuit as in the first embodiment while it has each pair of pre-drivers, gate controllers and output stages. It is thus possible to finely adjust the output driving capacity of the circuit with a minimum increase in the circuit size.

The buffer circuit 1100 of the fifth embodiment may be also altered in such ways as shown in the first embodiment and the second embodiment.

The present invention is not limited to the above embodiments but is susceptible of numerous changes and modifications as known to those skilled in the art. For example, the present invention may be applied to the case of using the circuit configuration which has the output buffer only, not having the input buffer. The use of the present invention allows the buffer circuit which performs output only to prevent a current from flowing back to the internal circuit upon input of an external voltage higher than a power supply voltage VDD to a terminal. Further, the number of I/O terminal which is connected to the buffer circuit is not restricted to one. For example, the buffer circuit may have both an input terminal and an output terminal, which are connected in internal wiring.

Furthermore, the N-well of the PMOS transistor P4 of the pre-driver 111 may be connected to the node 3.

It is apparent that the present invention is not limited to the above embodiment that may be modified and changed without departing from the scope and spirit of the invention.

What is claimed is:

1. A buffer circuit capable of switching between an input mode and an output mode, said buffer circuit comprising:
   a first transistor for outputting a prescribed voltage to an input/output terminal depending on a conductive state during the output mode of the buffer circuit, in accordance with a data signal to be output from said input/output terminal;
   a pre-driver for controlling the conductive state of the first transistor during the output mode of the buffer circuit, in accordance with said data signal; and
   a power supply circuit for providing a first power supply to the pre-driver during the output mode of the buffer circuit and providing or blocking the first power supply to the pre-driver in accordance with an input voltage to the input/output terminal during the input mode of the buffer circuit.

2. The buffer circuit according to claim 1, wherein, if the input voltage to the input/output terminal is higher than the first power supply, the input voltage to the input/output terminal is provided to a control terminal of the first transistor.

3. The buffer circuit according to claim 1, wherein the input voltage to the input/output terminal is provided to the control terminal of the first transistor through a gate controller placed between the input/output terminal and the control terminal of the first transistor.

4. The buffer circuit according to claim 1, wherein the input/output terminal is commonly used for both the input mode and the output mode of the buffer circuit.

5. The buffer circuit according to claim 1, further comprising:
   an N-well controller for controlling a voltage of an N-well area where a plurality of PMOS transistors are formed.

6. The buffer circuit according to claim 1, wherein the power supply circuit includes a power supply voltage switch and determines to provide or block the first power supply to the pre-driver depending on a conductive state of the power supply voltage switch.

7. A buffer circuit connected to an input/output terminal of a semiconductor apparatus, comprising:
   a first transistor for outputting a prescribed voltage to said input/output terminal depending on a conductive state, in accordance with a data signal to be output from said input/output terminal during an output mode of said buffer circuit;
   a pre-driver for controlling the conductive state of the first transistor in accordance with said data signal; and
   a power supply circuit for providing or blocking a first power supply to the pre-driver in accordance with an input voltage to the input/output terminal during an input mode of said buffer circuit.

8. The buffer circuit according to claim 7, wherein, if the input voltage to the input/output terminal is higher than the first power supply, the input voltage to the input/output terminal is provided to a control terminal of the first transistor.

9. The buffer circuit according to claim 7, wherein the input voltage to the input/output terminal is provided to the control terminal of the first transistor through a gate controller placed between the input/output terminal and the control terminal of the first transistor.

10. The buffer circuit according to claim 7, wherein the input/output terminal is commonly used for both an input mode and an output mode of the buffer circuit.

11. The buffer circuit according to claim 7, further comprising:
    an N-well controller for controlling a voltage of an N-well area where a plurality of PMOS transistors are formed.

12. The buffer circuit according to claim 7, wherein the power supply circuit includes a power supply voltage switch and determines to provide or block the first power supply to the pre-driver depending on a conductive state of the power supply voltage switch.

13. A buffer circuit capable of switching between an input mode and an output mode, said buffer circuit comprising:
    a first transistor for outputting a prescribed voltage to an input/output terminal depending on a conductive state during the output mode of the buffer circuit, in accordance with a data signal to be output during the output mode;
    a pre-driver for controlling the conductive state of the first transistor during the output mode of the buffer circuit, in accordance with said data signal to be output; and
    a power supply circuit for providing a first power supply to the pre-driver during the output mode of the buffer circuit, and, in accordance with an input voltage to the input/output terminal, selecting either one of the first power supply or the input voltage and providing a power supply to the pre-driver during the input mode of the buffer circuit.

14. The buffer circuit according to claim 13, wherein, if the input voltage to the input/output terminal is higher than the first power supply, the input voltage to the input/output terminal is provided to a control terminal of the first transistor.

15. The buffer circuit according to claim 13, wherein the input voltage to the input/output terminal is provided to the control terminal of the first transistor through a gate controller placed between the input/output terminal and the control terminal of the first transistor.

16. The buffer circuit according to claim 13, wherein the input/output terminal is commonly used for both the input mode and the output mode of the buffer circuit.

17. The buffer circuit according to claim 13, further comprising:
an N-well controller for controlling a voltage of an N-well area where a plurality of PMOS transistors are formed.

18. The buffer circuit according to claim 13, wherein the power supply circuit includes a power supply voltage switch for providing the first power supply to the pre-driver, and an input/output terminal voltage transfer for providing the voltage at the input/output terminal to the pre-driver, and if the voltage at the input/output terminal is lower than the first power supply, the power supply voltage switch becomes conductive and, if the voltage at the input/output terminal is higher than the first power supply, the input/output terminal voltage transfer becomes conductive.

19. The buffer circuit according to claim 18, wherein the power supply voltage switch is controlled to become conductive by a supply controller and controlled to become nonconductive by a cutoff controller in accordance with the voltage at the input/output terminal.

20. The buffer circuit according to claim 18, wherein the input/output terminal voltage transfer becomes conductive in accordance with the voltage at the input/output terminal.

* * * * *